(12) United States Patent
Arena et al.

(10) Patent No.: US 7,842,574 B2
(45) Date of Patent: Nov. 30, 2010

(54) METHOD OF MANUFACTURING A SEMICONDUCTOR POWER DEVICE

(75) Inventors: Giuseppe Arena, Catania (IT); Caterina Donato, Acicatena (IT); Cateno Marco Camalleri, Catania (IT); Angelo Magri, Belpasso (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 160 days.

(21) Appl. No.: 11/971,114

(22) Filed: Jan. 8, 2008

(65) Prior Publication Data
US 2008/0211015 A1 Sep. 4, 2008

Related U.S. Application Data

(63) Continuation-in-part of application No. PCT/EP2006/064035, filed on Jul. 7, 2006.

(30) Foreign Application Priority Data
Jul. 8, 2005 (EP) .................................. 05425483

(51) Int. Cl.
*H01L 21/336* (2006.01)
(52) U.S. Cl. ................ 438/270; 257/330; 257/E29.133

(58) Field of Classification Search .................. 257/330, 257/E29.133; 438/270
See application file for complete search history.

(56) References Cited

U.S. PATENT DOCUMENTS

| | | | |
|---|---|---|---|
| 6,194,741 B1 | 2/2001 | Kinzer et al. | |
| 6,291,298 B1 | 9/2001 | Williams et al. | |
| 6,528,355 B2 | 3/2003 | Hirler et al. | |
| 6,800,509 B1 | 10/2004 | Lin et al. | |
| 2003/0030092 A1 | 2/2003 | Darwish et al. | |
| 2004/0041207 A1 | 3/2004 | Takano et al. | |

*Primary Examiner*—Matthew C Landau
*Assistant Examiner*—Jessica Hall
(74) *Attorney, Agent, or Firm*—Lisa K. Jorgenson; E. Russell Tarleton; Seed IP Law Group PLLC

(57) ABSTRACT

A trench is formed in a semiconductor body, the side walls and the bottom of the trench covered with a first dielectric material layer, the trench filled with a second dielectric material layer, the first and the second dielectric material layers are etched via a partial, simultaneous, and controlled etching such that the dielectric materials have similar etching rates, a gate-oxide layer having a thickness smaller than the first dielectric material layer deposited on the walls of the trench, a gate region of conductive material formed within the trench, and body regions and source regions formed within the semiconductor body at the sides of and insulated from the gate region. Thereby, the gate region extends only on top of the remaining portions of the first and second dielectric material layers.

19 Claims, 4 Drawing Sheets

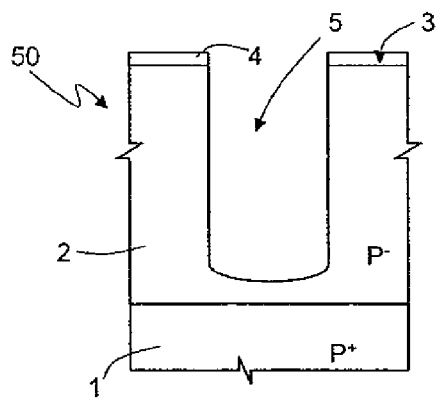
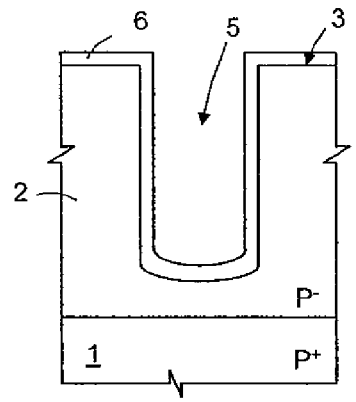
Fig.1  Fig.2
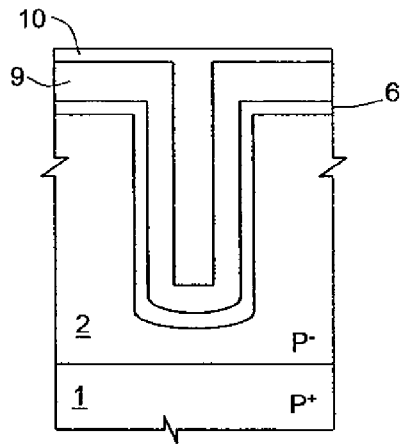
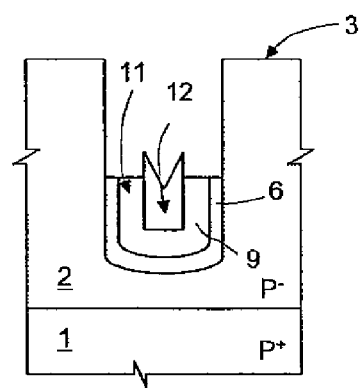
Fig.3  Fig.4
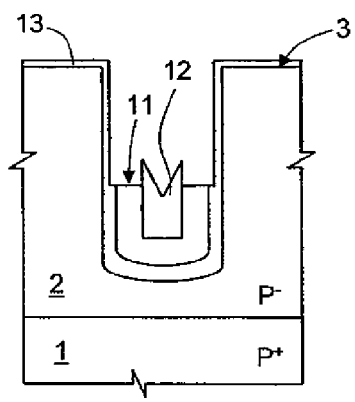
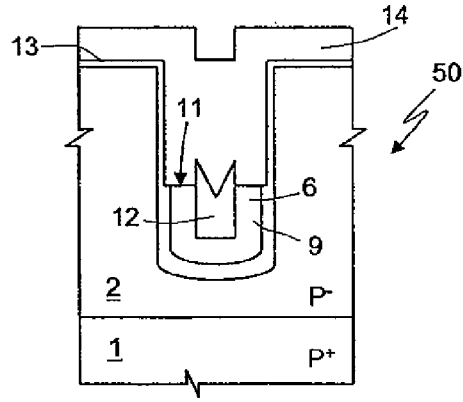
Fig.5  Fig.6

METHOD OF MANUFACTURING A SEMICONDUCTOR POWER DEVICE

BACKGROUND

1. Technical Field

The present disclosure relates to a process for manufacturing an insulated-gate semiconductor power device and, more specifically, to a method for manufacturing a power MOS device of the type using a trench for insulating the gate of the device (hereinafter referred to as trench-gate device), as well as to a method for manufacturing a power MOS device or a device of the Insulated Gate Bipolar Transistor—IGBT-type.

2. Description of the Related Art

As is known, power MOS devices utilize a plurality of cells, each having its own gate adjacent to body and source regions. In the manufacturing process of trench-gate power MOS devices, in each elementary cell of the device, the gate of the MOS structure is made by digging a trench in the silicon substrate, coating the walls of the trench with a thin oxide layer, referred to as gate oxide, and then totally filling the trench with polysilicon. In this structure, the channel of the device is formed along the vertical walls of the trench.

A MOS structure formed by stacking of silicon, oxide, and polycrystalline silicon has considerable advantages as compared to a device made using planar technology. In fact, the resistance associated with the JFET area, due to the opposed body wells of the device, is totally eliminated, thus improving the performance characteristics of the device when it is on, and the dimensions of the device are scaled, thereby increasing the amount of current that can be carried relative to prior devices.

On the other hand, this structure has some problems. In fact, in the bottom area of the trench a crowding of the electric field lines is created, which brings about, for a same flowing current, a reduction in the breakdown voltage of the device. In addition, as compared to a planar structure, for a same active area, there occurs a considerable increase in the gate-oxide area, even in non-useful areas, where the channel is not formed, i.e., in the parts of the gate oxide that extend underneath the body. The increase in the area occupied by the gate oxide entails an increase in the parasitic capacitances linked to the gate terminal of the device, and hence in the gate charge as compared to planar structures.

The first problem (crowding of the field lines) is currently solved by providing the trench with a U-shaped profile, rounded at its bottom end. In this way, in fact, there is a smaller reduction in the breakdown voltage of the device. The second problem (increase in the gate oxide area), instead, is solved either by depositing in the trench a thick oxide layer, which coats only the bottom of the trench, following its U-shaped profile and thus forming a double gate-oxide layer in the bottom part of the trench, or else by depositing in the trench a thick oxide layer, which coats the bottom of the trench filling it up to a certain height.

The advantages deriving from the use of the above two process solutions are various:

an increase in the breakdown voltage of the device since the thick oxide layer performs the function of "field loop", i.e., preventing crowding of the lines of electric field at the bottom of the trench;

an increase in the breakdown voltage of the gate oxide since the gate thin oxide no longer comprises the part of the wall where there is a variation in the crystallographic orientation of the silicon; in this area, in fact, the thickness of gate oxide is not controllable and could cause premature breakdown of the device;

a decrease in the parasitic capacitance linked to the gate terminal of the device; and an achievement of a good compromise between the increase in the breakdown voltage and the reduction in the output resistance of the device.

A method used for depositing a thick oxide layer in the trench, which coats only the bottom of the trench following its U-shaped profile, is described in U.S. Pat. No. 6,528,355 B2. This patent discloses a method for obtaining a power MOS transistor with a trench as shown in the cross-sections of FIGS. 13a and 13b, which illustrate the structure half-way through the process and at the end of the process, respectively. The sequence of the fabrication steps is described hereinafter. An epitaxial layer 32 is grown on a silicon substrate 31 and material that functions as a mask (for example, a silicon dioxide layer) is deposited on the epitaxial layer 32. The epitaxial layer 32 is etched to form one or more trenches, using a photolithography for defining the mask. After mask removal, the walls and the bottom of the trenches are coated with a dielectric film (for example, silicon dioxide), which functions as a field oxide 41. The trench is then filled with an auxiliary layer (for example, photoresist), which is then etched so as to leave a plug 42 within the trench, the top surface whereof lies underneath the top surface of the semiconductor body.

Next, the field oxide 41 is wet etched chemically and partially removed so as to remain only on the bottom of the trench, following its U-shaped profile, where the field oxide is protected by the plug 42. The structure of FIG. 13a is thus obtained. Then, the plug 42 is removed and a gate insulating film 43 (for example, of silicon dioxide), thinner than the field oxide 41, is grown. Finally, a body 37, a gate 44 (of polycrystalline silicon that fills the trench), a source 38 and the corresponding metallizations are made, to obtain the structure of FIG. 13b (wherein, however, the metallizations are not shown, for sake of clarity).

The process just described has, however, many problems.

First, the process of etching the auxiliary layer intended to form the plugs 42 within the trenches is not readily controllable and can determine an erroneous sizing of the plugs, thus causing poor operation of the device. In particular, if the plugs 42 are not deep enough, i.e., they have a depth such that the thick oxide 41 reaches the channel area, the threshold voltage of the device becomes very variable. In addition, the variability of the depth of the plugs 42 brings about a variable surface ratio between the gate thin oxide and the thick oxide and consequently also causes variability in the capacitance between the gate terminal and the drain terminal. Finally, the variability in the depth of the plugs, and hence the variability in the passage between the gate thin oxide 43 and the thick oxide 41, alters the distribution of the lines of electric field with consequent alteration of the breakdown voltage of the device.

Another fundamental problem of the process described by the patent referred to above is that the wet etching of the thick oxide layer not covered by the plug 42 introduces critical conditions in controlling the distance D between the lower end of the body 37 and the top surface of the thick oxide 41 that coats the wall of the trench.

In fact, it is not easy during the deposition of the first auxiliary layer (photoresist) to fill the trench completely without forming voids and to maintain a constant distance D at every point of each single silicon wafer and, even more, to maintain it constant between two different silicon wafers.

This problem is particularly experienced when the etching of the auxiliary layer is made using an oxygen plasma, which, by its very nature, renders the etching isotropic, but is characterized by a non-uniformity in the etching rate (a non-uniformity of approximately 10-15%) between the different points of the silicon wafer and between two distinct silicon wafers.

Also the removal of the thick oxide from the wall of the trench not covered by the plug presents problems due to the fact that usually hydrofluoric-acid (HF) based solutions are used for the etching. In this case, the etching rate depends upon the concentration of the solution and upon the process temperature and is not uniform by approximately 5-10% in the different points of the silicon wafer and between two distinct silicon wafers. In addition, in wet etching it is possible to control only the etching time, but it is not possible to control the end point of the etching.

Finally, in current MOS structures, the attempt is made to provide trenches that are as narrow as possible (even smaller than 0.6 μm) so that capillarity phenomena could be triggered. This could cause, using the wet etching of the known process described above, significant variations in the etching rate and non-uniformity of the etching of the oxide inside the trench.

Consequently, it is particularly important to identify new strategies to overcome the problems of the prior methods and ensure that the etching for forming the trench has a rate that is as uniform as possible and that is such as to enable control of the end point of the etch.

BRIEF SUMMARY

The present disclosure provides a method for manufacturing a power device as well as the realized power device that will satisfy the requirements described above.

In accordance with one embodiment of the present disclosure, a process for manufacturing a semiconductor power device is provided, the process including the steps of forming a semiconductor body of a first conductivity type and having a top surface; forming, in said semiconductor body, a trench having side walls and a bottom; coating said side walls and said bottom of said trench with a first dielectric material layer; filling said trench with a second dielectric material layer; etching said first dielectric material layer via an etching process; forming a gate-oxide layer on said walls of said trench; forming a gate region of conductive material within said trench and surrounded by said gate-oxide layer; and forming, within said semiconductor body, a body region having a second conductivity type and a source region having said first conductivity type, said first and second dielectric material layers comprising materials having similar responses to said etching process, and said etching step comprising simultaneously etching said first dielectric material layer and said second dielectric material layer so as to remove said first and second dielectric material layers in a partial, simultaneous and controlled way within said trench.

In accordance with another embodiment of the present disclosure, a semiconductor power device is provided that is formed by the foregoing method, the power device including a semiconductor body having a first conductivity type and a surface; a trench, formed in said semiconductor body and having side walls; an insulating region extending along a bottom portion of said side walls of said trench, said insulating region formed by a first dielectric material and having a first thickness; a gate-oxide layer extending on said side walls of said trench and on top of said insulating region, said gate-oxide layer having a second thickness smaller than said first thickness; a gate region of conductive material, extending within said trench and surrounded by said gate-oxide layer; a body region of a second conductivity type, extending within said semiconductor body, at the sides of said gate-oxide layer and into said gate region; a source region of said first conductivity type, extending within said semiconductor body at the sides of said gate-oxide layer and into said gate region and on top of said body region; and a filling region of a second dielectric material, different from said first dielectric material, said filling region surrounded at the sides and at the bottom by said insulating region, said gate region extending on top of said filling region and said insulating region.

In accordance with another embodiment of the present disclosure, a method is provided, the including forming a trench in a semiconductor body; coating side walls and a bottom of the trench with a first dielectric material; forming an oxide layer on the first dielectric material layer; filling the trench with a second dielectric material; and removing a portion of the first dielectric material layer, the oxide, and the second dielectric material using an etching process that simultaneously and partially removes the first dielectric material layer, the oxide, and the second dielectric material.

In accordance with another aspect of the foregoing embodiment, the method further includes forming a gate oxide layer on the walls of the trench exposed by the etching process; filling the trench with a conductive material to form a gate region; and forming in the semiconductor body a body region and a source region.

In accordance with another aspect of the foregoing embodiment, the first dielectric material is TEOS (tetraethylorthosilicate) and the second dielectric material is silicon nitride.

In accordance with another aspect of the foregoing embodiment, the method includes the step of forming a trench in the semiconductor body is followed by implanting dopant ion species in forming a modified conductivity region underneath the trench.

BRIEF DESCRIPTION OF THE SEVERAL VIEWS OF THE DRAWINGS

For an understanding of the present disclosure, some preferred embodiments thereof are now described, purely by way of non-limiting example, with reference to the attached drawings, wherein:

FIGS. 1 to 8 show cross-sections through a semiconductor wafer in successive device manufacturing steps, according to a first aspect of the disclosure;

DETAILED DESCRIPTION

Figure 7:
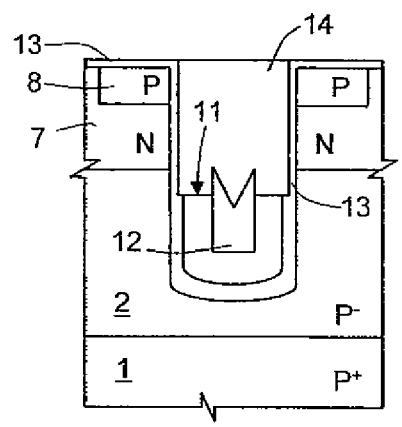

In particular, FIG. 1 shows a wafer 50 of semiconductor material, which includes a heavily doped substrate 1 (for example, of $P^+$ type) and a less doped semiconductor layer (in the example, of $P^-$ type), which is, for example, epitaxially grown on top of the substrate 1 (epitaxial layer 2), and has a top surface 3. A dielectric layer is formed thereon, for example of silicon oxide either deposited or grown thermally, or else of deposited silicon nitride, or a combination of the two, so as to present a total thickness in the range of 0.2-1 µm. The dielectric layer is then defined so as to form a trench mask 4 used to etch the epitaxial layer 2 and form a trench 5.

As illustrated in FIG. 2, after forming the trench 5, the trench mask 4 is removed, and a dielectric material layer 6 is formed (for example, of silicon oxide having a thickness in the range of 0.1-0.3 µm deposited or grown, or a multilayer obtained through oxidation and deposition), which coats the surface 3 and the walls of the trench 5.

Then (FIG. 3), a thick oxide layer 9, for example of TEOS (tetraethylorthosilicate), is deposited with LPCVD (Low-Pressure Chemical Vapor Deposition) on the dielectric material layer 6. An auxiliary layer 10 is deposited, for example via LPCVD, on top of the thick oxide layer 9. The auxiliary layer 10 is of dielectric material, for example silicon nitride, which has a response to the etching process similar to that of the thick oxide layer 9 (approximately the same etching rate) and fills the trench 5.

Next, the layers 6, 9 and 10 are etched via a dry-etching process, which leaves the surface 3 of the epitaxial layer 2 unaltered and etches the auxiliary layer 10 at a rate comparable to that of the layers 6 and 9. For example, carrying out a plasma-etching process with a tetrafluoromethane ($CF_4$)/trifluoromethane ($CHF_3$)/argon reactive gas, which etches the silicon nitride and the TEOS selectively at rates that stand in a ratio of approximately 1:1. The following results are obtained simultaneously: the layers 9 and 10 are etched simultaneously and in a controlled way; the dielectric material layer 6, which functions as a mask, is completely removed; and the surface 3 of the epitaxial layer 2 remains uncovered but almost unaltered, since the used plasma selectively etches the dielectric material layer 6 and the surface 3 at rates that stand in a ratio of 6:1.

FIG. 4 shows the structure obtained after the etching process. As may be noted, the trench 5 accommodates a cup-shaped region 11, formed by the part of the thick oxide layer 9 and of dielectric material 6 remaining along the walls of the trench 5, and, within the cup-shaped region 11, a filling region 12 of silicon nitride, the top profile whereof remains forked on account of the selectivity of the etching process.

Next, an oxidation is carried out, which leads to the thermal growth of a gate layer 13 of dielectric material (for example, silicon oxide) on the surface 3 and on the uncovered walls of the trench 5 (FIG. 5). Then (FIG. 6), a conductive material layer 14 is deposited, for example polycrystalline silicon, which fills the trench 5. The conductive material layer 14 can be deposited already doped (doped in situ) or else can be doped subsequently, via a dedicated ion implantation. Next (FIG. 7), body regions 7, of N-type conductivity (obtained, for example, by doping the silicon with As, Sb or P) and source regions 8 of P-type conductivity (obtained, for example, by doping the silicon with B, $BF_2$, Al or In) are implanted.

Then the conductive material layer 14 is etched and the surface of the wafer 50 is planarized using standard and well-known manufacturing processes (e.g., chemical and mechanical planarization—CMP). The structure of FIG. 7 is thus obtained, wherein the gate region formed by the remaining portion of the conductive material layer 14 is once again designated by 14.

Figure 8:
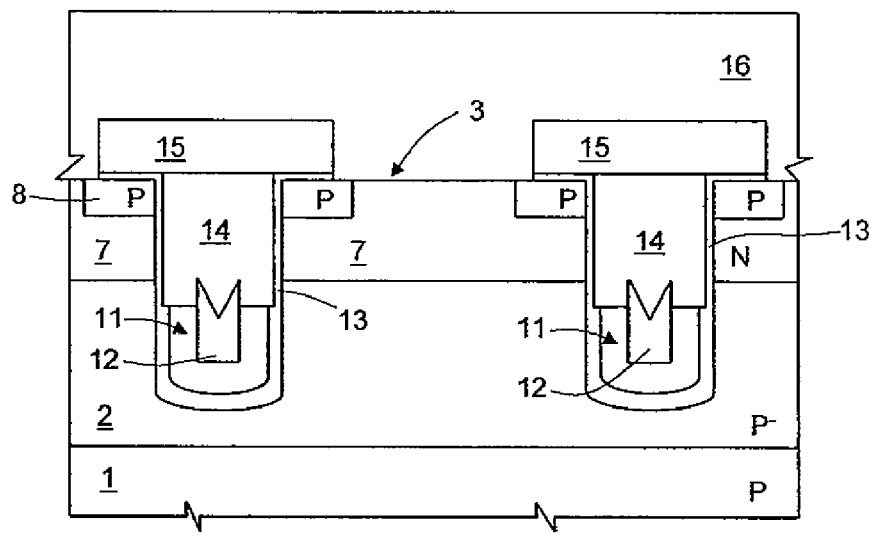

Then, an insulating layer 15, for example of silicon oxide, is deposited over all the surface of the wafer 50 and is then selectively etched in order to open the contacts towards the surface 3. Finally, a layer or a plurality of source-metallization layers 16 is deposited, leading to the final structure of FIG. 8, forming a P-channel insulated-gate power device, whereof two elementary cells are shown.

In the process described above, the etching for forming the structure of FIG. 4 can include an over-etching for a pre-set time, performed after reaching the end point of the etching of the part of layers 6, 9 on top of the surface 3, using the same etching plasma (the time of this step is set as a percentage with respect to the end-point time, recorded in the preceding step). In this way, advantageously, the distance between the top surface of the cup-shaped region 11 and the lower end of the body region 7 can be varied.

Figure 9:
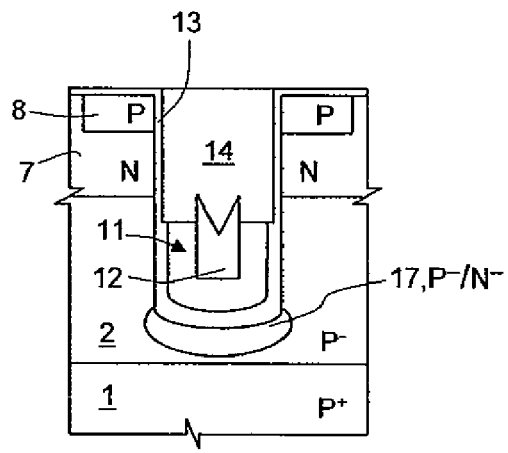
FIG. 9 shows the cross-section of the final structure of the device, obtained according to a second aspect of the disclosure.

FIG. 9 shows the structure in an intermediate device manufacturing step, obtained by implementing a variant of the method, wherein, after forming the trench 5, described with reference to FIG. 2, a modified-conductivity region 17 is formed under the trench 5 via ion implantation of a dopant species with conductivity of P or N type. In this way, the type or the level of doping of the epitaxial layer 2 or both are altered. In particular, if the implantation is of the same type as that of the epitaxial layer 2, here of P type, it brings about an enrichment of the doping of the epitaxial layer 2, so that the modified-conductivity region 17 has a conductivity of $P^+$ type. Thereby, the output resistance of the device is reduced. If, instead, the implantation is performed with dopant species of an opposite type to the epitaxial layer 2, hence here of N type, it causes an impoverishment thereof (and the modified-conductivity region 17 is of $P^-$ type) or even a conductivity reversal (and the modified-conductivity region 17 is of $N^-$ type). In this case, the breakdown voltage increases, and the bottom area of the trench 5 is protected from the crowding of the lines of the electric field.

In the case of IGBT devices, the presence of a modified-conductivity region 17 of an opposite type to the substrate 2 contributes to an increase in the robustness of the device in given conditions of dynamic stress wherein it is necessary to eliminate the minority carriers. In addition, since the modified-conductivity region 17 is implanted after forming the trench 5, when the trench mask 4 is still present, no other photolithography for defining the implantation regions is necessary. Consequently, the process is self-aligned with the pre-existing geometries of the device.

Figure 10:
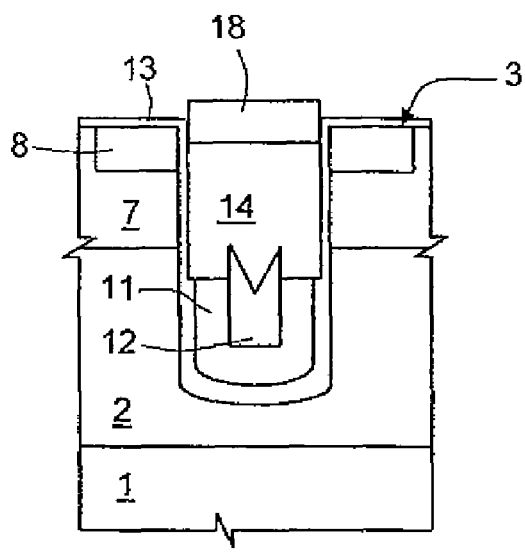
FIG. 10 shows the cross-section of the final structure of the device, obtained according to a third aspect of the disclosure.

FIG. 10 shows the structure in an intermediate device manufacturing step, according to a third embodiment of the method according to the present disclosure, wherein, after forming the gate region 14, a metal layer 18 is formed on the latter, for example, of cobalt silicide, titanium silicide, or tungsten silicide. The layer 18 is preferably formed by sputtered deposition of a thin metal layer (Co, Ti, W, etc.); sintering of the metal layer via a thermal treatment; and removal of the non-sintered metal layer, via a wet etching, using, for instance, turpentine.

In this way, the metal layer 18 is formed only over the surface of the gate region 14, of polycrystalline silicon, since the surface 3 of the epitaxial layer 2 is coated by the oxide layer 13. This variant of the method enables a reduction in the gate resistance due to the connection in parallel between the gate region 14 of polycrystalline silicon and the metal layer 18. In addition, the process is self-aligned; i.e., it does not require the use of additional phototechniques.

Figure 11:
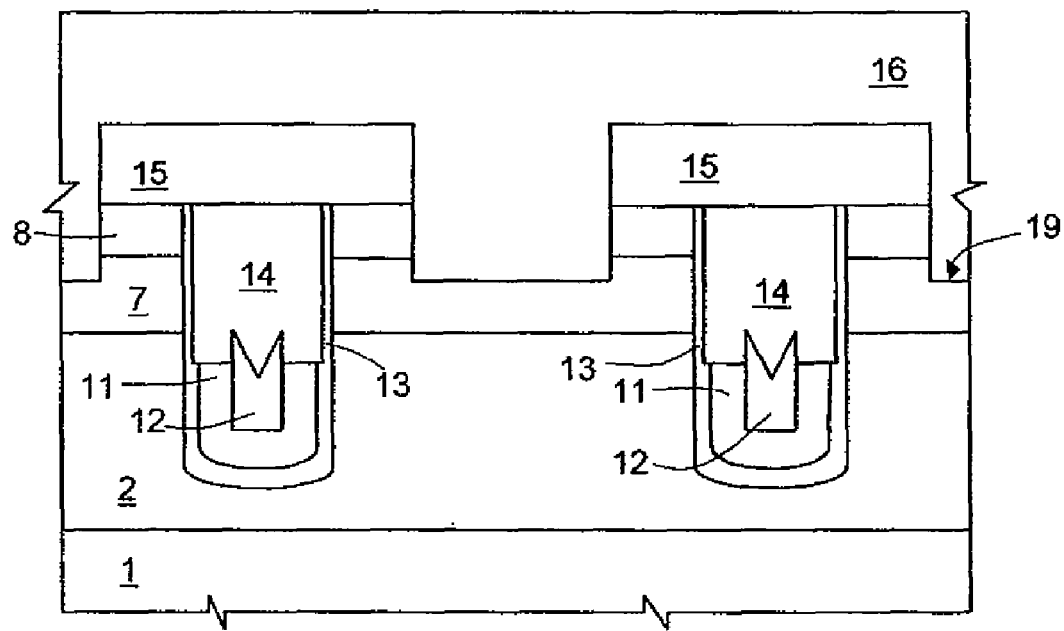
FIG. 11 shows the cross-section of the final structure of the device, obtained according to a fourth aspect of the disclosure.

In fact, it is of considerable importance to reduce the number of photolithographies used during the fabrication of the device. To this end, according to a fourth embodiment of the present method, the dopant species for forming the source region 8 is an implanted blanket, i.e., without the use of masks. FIG. 11 shows the structure obtained implementing this fourth embodiment of the method. In particular, after forming the gate region of the device according to any one of the three variants already described (at the end of the step of FIG. 6), the following steps are performed: depositing, over the whole surface of the device, an insulating layer 15 of dielectric material (for example, deposited oxide); opening contacts through a dedicated photolithography; forming microtrenches 19, which extend from the surface of the layer 15 as far as the body regions 7 with the aim of connecting the body regions 7 with the source regions 8 (in particular, the microtrenches 19 are deeper than the source regions 8 and shallower than the body regions 7); and depositing the source metallization layer 16 over the entire insulating layer 15 so as to fill the microtrenches 19.

Figure 12:
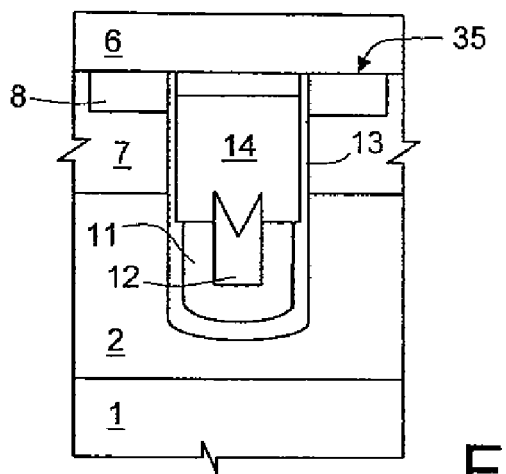
FIG. 12 shows the cross-section of the final structure of the device, obtained according to a fifth aspect of the disclosure.
Figure 13A:
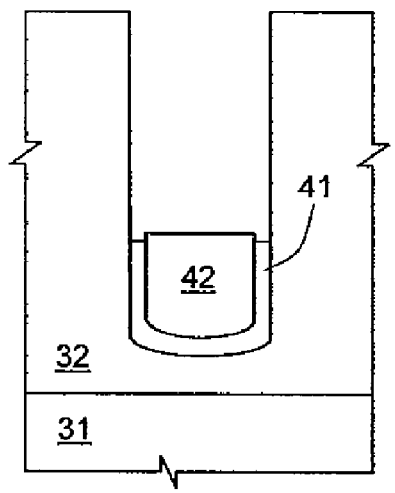
FIGS. 13a and 13b show cross-sections of the structure of the semiconductor device in two intermediate process steps, obtained according to the method described in the U.S. Pat. No. 6,528,355 B2.
Figure 13B:
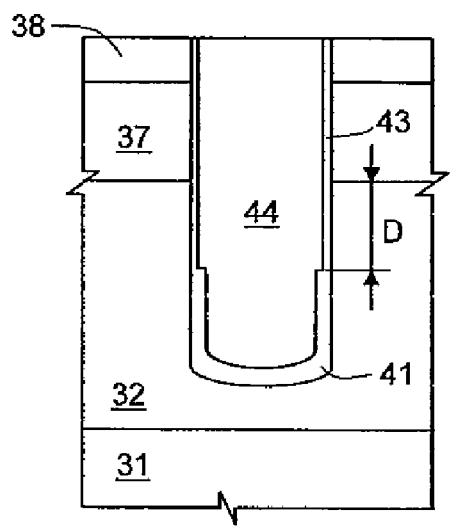

Finally, according to a fifth aspect of the method according to the present disclosure, during etching of the conductive material layer forming the gate region 14 of the device according to any one of the first three described variants, the etching time is increased so as to remove the material of the conductive material layer 14 even just partially within the trench 5. The depth of the portion removed should not, however, exceed the depth of the source region 8. Thereby, the part of the trench 5 not filled by the semiconductor material of the layer 14 is advantageously filled with a plug region 35 of dielectric material, formed through a deposition step followed by isotropic etching or by chemico-mechanical abrasion (CMP). Finally, the source metallization layer 16 is deposited over the whole surface of the device. The final structure is shown in FIG. 12.

The method described to provide P-channel insulated-gate power devices can be likewise applied to provide N-channel insulated-gate devices, reversing the conductivity of the silicon substrate 1 and the dopant species implanted in the body regions 7 and source regions 8.

The described method and its variants have considerable advantages. In particular, the described solutions use only materials deposited via chemical vapor deposition (CVD), or else via plasma-enhanced chemical vapor deposition (PECVD), or via low-pressure chemical vapor deposition (LPCVD), and exploit appropriate dry etching rather than wet etching.

Thereby, the described solutions are repeatable, enable simplification of the process flow, in so far as the sequence of fabrication steps is reduced, for example by reducing the number of photolithographies, and are, consequently, far less expensive.

Another advantage is that dry etches ensure a uniform etching rate and a control of the etching end point. This enables a good control over the height of the oxide plugs within the trench.

In addition, in the case of scaled devices and of narrower trenches, the problems linked to the formation of voids in the auxiliary layer (for example, photoresist) that fills the trench are prevented. The process described is, then, applicable also for trenches the width of which is less than a micron.

Finally, an advantage of the present device lies in the fact that the portion of the thick oxide layer 9 that remains on the bottom of the trench 5 contributes to reducing the parasitic capacitance associated with the gate and drain electrodes.

Finally, it is clear that numerous modifications and variations can be made to the manufacturing method and to the device described and illustrated herein, all of which fall within the scope of the invention, as defined in the attached claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing a semiconductor power device, comprising the steps of:
forming a semiconductor body of a first conductivity type and having a top surface;
forming, in said semiconductor body, a trench having side walls and a bottom;
coating said side walls and said bottom of said trench with a first dielectric material layer;
filling said trench with a second dielectric material layer and an auxiliary dielectric material layer;
etching said first, second, and auxiliary dielectric material layers via an etching process wherein, at the end of said etching step, said trench houses, at the bottom, portions of said first, second, and auxiliary dielectric material layers, said portions of the first and second dielectric material layers having a depth that is approximately equal and the auxiliary layer has a forked top profile;
forming a gate-oxide layer on said walls of said trench;
forming a gate region of conductive material within said trench and surrounded by said gate-oxide layer; and
forming, within said semiconductor body, a body region having a second conductivity type and a source region having said first conductivity type,
said first, second, and auxiliary dielectric material layers comprising materials having similar responses to said etching process, and said etching step comprising simultaneously etching said first dielectric material layer, said second dielectric material layer, and said auxiliary dielectric material layer so as to remove a portion of each of said first, second, and auxiliary dielectric material layers in a partial, simultaneous and controlled way within said trench.

2. The process according to claim 1 wherein said etching step comprises removing said first, second, and auxiliary dielectric material layers from said surface and continuing said etching step so as to remove a further portion of said first, second, and auxiliary dielectric material layers.

3. The process according to claim 1 wherein said etching step comprises using a dry etching process.

4. The process according to claim 3 wherein said dry etching process comprises carrying out a plasma etch with a reactive gas.

5. The process according to claim 4 wherein said reactive gas comprises tetrafluoromethane ($CF_4$)/trifluoromethane ($CHF_3$)/argon.

6. The process according to claim 1 wherein said first dielectric material layer is silicon dioxide, said second dielectric material layer is TEOS (tetraethylorthosilicate), and said auxiliary dielectric material layer is silicon nitride.

7. The process according claim 1 wherein said step of forming a trench in said semiconductor body is followed by implanting dopant ion species and forming a modified-conductivity region underneath said trench.

8. The process according to claim 1 wherein said step of forming a gate region is followed by forming a metal layer on top of said gate region.

9. The process according to claim 8 wherein the step of forming a metal layer comprises a silicidation step using a metal from the group of cobalt, titanium, and tungsten.

10. The process according to claim 1 wherein said step of forming a source region comprises a blanket implantation of a dopant species.

11. The process according to claim 10 wherein said steps of forming a body region and a source region are followed by the steps of:

depositing an insulating layer on said surface;

forming an opening extending through said insulating layer and said source region and partially into said body region; and filling said opening with metal.

12. The process according to claim 1 wherein said step of forming a gate region is followed by partially removing said conductive material within said trench and filling said trench with dielectric material.

13. The process according to claim 12 wherein said step of partially removing said conducting material is followed by a step of depositing a gate metallization layer.

14. The process according to claim 1 wherein said second dielectric material layer has a first thickness and said gate-oxide layer has a second thickness smaller than said first thickness.

15. A method, comprising:

forming a trench in a semiconductor body;

coating side walls and a bottom of the trench with a first dielectric material;

forming an oxide layer on the first dielectric material layer;

filling the trench with a second dielectric material; and removing a portion of the first dielectric material layer, the oxide, and the second dielectric material using an etching process that simultaneously and partially removes the first dielectric material layer, the oxide, and the second dielectric material and forms a forked top profile on the second dielectric material.

16. The method of claim 15, comprising the further steps of:

forming a gate oxide layer on the walls of the trench exposed by the etching process;

filling the trench with a conductive material to form a gate region; and forming in the semiconductor body a body region and a source region.

17. The method of claim 16 wherein the step of forming a trench in the semiconductor body is followed by implanting dopant ion species to form a modified conductivity region underneath the trench.

18. The method of claim 15 wherein the oxide layer comprises TEOS (tetraethylorthosilicate) and the second dielectric material comprises silicon nitride.

19. The method of claim 15, wherein removing comprises etching the first dielectric material layer, the oxide layer, and the second dielectric material so that the first dielectric material layer and the oxide have a depth that is approximately equal.

* * * * *